United States Patent
Steijer et al.

[11] Patent Number: 5,985,185
[45] Date of Patent: Nov. 16, 1999

[54] OPTOCOMPONENT CAPSULE HAVING AN OPTICAL INTERFACE

[75] Inventors: Odd Steijer, Bromma; Hans-Christer Moll, Enskede; Paul Eriksen, Tyresö; Jan-Åke Engstrand, Trängsund, all of Sweden

[73] Assignee: Telefonaktiebolaget LM Ericsson, Stockholm, Sweden

[21] Appl. No.: 08/817,422

[22] PCT Filed: Oct. 19, 1995

[86] PCT No.: PCT/SE95/01233

§ 371 Date: Jul. 14, 1997

§ 102(e) Date: Jul. 14, 1997

[87] PCT Pub. No.: WO96/13069

PCT Pub. Date: May 2, 1996

[30]     Foreign Application Priority Data

Oct. 19, 1994  [SE]  Sweden ................................. 9403574

[51] Int. Cl.⁶ ............................... B29C 33/10; G02B 6/00
[52] U.S. Cl. ................... 264/1.7; 264/1.25; 264/272.15; 264/272.17; 385/14; 385/89; 425/116; 425/543
[58] Field of Search ................. 264/1.24, 1.25, 264/272.14, 272.15, 272.17, 1.7; 425/116, 117, 121, 543, 544; 385/14, 89

[56]     References Cited

U.S. PATENT DOCUMENTS

| | | | |
|---|---|---|---|
| 4,410,469 | 10/1983 | Katagiri et al. ........................ | 264/1.25 |
| 4,507,345 | 3/1985 | Stoll et al. . | |
| 4,520,061 | 5/1985 | Stoll et al. . | |
| 5,079,190 | 1/1992 | Mihara .............................. | 264/272.15 |
| 5,133,921 | 7/1992 | Yokoyama ......................... | 264/272.15 |
| 5,199,093 | 3/1993 | Longhurst . | |
| 5,214,730 | 5/1993 | Nagasawa et al. . | |
| 5,286,426 | 2/1994 | Rano, Jr. et al. .................. | 264/272.15 |
| 5,337,094 | 8/1994 | Mizuno et al. . | |
| 5,391,346 | 2/1995 | Nakamura et al. ................ | 264/272.15 |
| 5,475,775 | 12/1995 | Kragl et al. ............................ | 264/1.25 |
| 5,482,658 | 1/1996 | Lebby et al. ....................... | 264/272.15 |
| 5,715,338 | 2/1998 | Sjolinder et al. ......................... | 385/14 |
| 5,774,614 | 6/1998 | Gilliland et al. ......................... | 385/88 |
| 5,818,990 | 10/1998 | Steijer et al. ............................ | 385/89 |

FOREIGN PATENT DOCUMENTS

| | | |
|---|---|---|
| 0 482673 A2 | 4/1992 | European Pat. Off. . |
| 0 484180 A1 | 5/1992 | European Pat. Off. . |
| 0 496331 A2 | 7/1992 | European Pat. Off. . |
| 0 530744 A1 | 3/1993 | European Pat. Off. . |
| 0 635 741A2 | 1/1995 | European Pat. Off. . |
| 451 623 | 10/1987 | Sweden . |
| 94/00907 | 3/1994 | Sweden . |
| WO94/28448 | 12/1994 | WIPO . |

*Primary Examiner*—Mathieu D. Vargot
*Attorney, Agent, or Firm*—Burns, Doane, Swecker & Mathis, L.L.P.

[57]     ABSTRACT

In encapsulating an optocomponent with a plastics material, an MT-connector compatible interface is obtained having bores for guide pins in the wall of the capsule and optical connection surfaces. These bores are obtained from mold cavity guide pins that are used for aligning the optocomponent in a mold cavity in a mold in the molding operation of the encapsulating material on top of the component. In order to achieve a good accuracy in the positioning of the component during the molding operation, the mold guide pins are as short as possible and end directly behind the component where they are supported by projections extending from each mold half. Thus, cavities are created extending straight through the capsule behind the component. The cavities allow that the guide pin bores are cleansed and that material residues are removed after the molding operation. Further, the cavities can be used for spring clamps for retaining the optocomponent capsule at an optical connector having a similar interface. The clamps can then have tongues that are inserted in the cavities and that, in addition, can be provided with holes through which the guide pins can be pushed to safeguard the clamps against being lost.

22 Claims, 4 Drawing Sheets

OPTOCOMPONENT CAPSULE HAVING AN OPTICAL INTERFACE

The present invention relates to methods and devices for obtaining an MT-device compatible interface in the capsule wall when encapsulating optocomponents with a plastics or resin material, and further it relates to the manufactured capsule having means for retaining it at another component.

BACKGROUND

In the earlier Swedish patent application SE-A 9400907-3, filed Mar. 18, 1994, a method is described of encapsulating optocomponents by means of transfer moulding and of obtaining an optical interface in the wall of the capsule at the same time. This method is developed from the conventional method for encapsulating microelectronic circuits, where an electrically conducting leadframe is used for establishing an electric connection to microelectronic circuit chips. The leadframe usually consists of a punched or etched metal piece, e.g. a thin copper or aluminium sheet. The leadframe comprises a special, suitably adapted portion termed "flag", onto which a microelectronic circuit is mounted before being moulded into the encapsulating material. Before the moulding embedment, the microcircuit chip is also electrically connected to contact pins of the leadframe by friction welding, "bonding" by means of "bonding" wires to "legs" or "fingers" of the leadframe.

Moreover, when encapsulating optocomponents an optical interface is to be formed in the wall of the capsule having a high accuracy as to the position of the component in relation to another component or a connector device, to which the encapsulated component is to be connected or coupled. The required mechanical accuracy is achieved by mounting the optocomponents on a common carrier or substrate such as a plate, which thereafter is attached to the flag. Finally the carrier is positioned in relation to the external geometry. For an optical interface, which is compatible with an optical multi-fiber contact of MT-device type, this is achieved by means of V-grooves on the carrier plate, in which guide pins extending through the mould cavity fit. These guide pins are pulled out after the encapsulating operation and then leave circular cylindrical holes in the encapsulation material. Into these holes, loose cylindrical guide pins are then inserted, at connection of the optocomponent or another device having the same optical interface.

In U.S. Pat. No. 5,199,093 optical fiber connectors encapsulated with plastics are disclosed. One connector I of the device pair (FIG. 1), consisting of a moulded plastics body 2, comprises guide pins 3 like in an MT-device, and a passive integrated optical circuit board 6 connected to an optical fiber 4, where one side of the board 6 is exposed and centrally arranged between the guide pins 3. In the embodiment shown in FIG. 2 there are no guide pins, but here an optical contact device protrudes outside the rest of the capsule and the guiding is provided by means of a sleeve.

The published European patent application EP-A2 0 482 673 relates to an optical connector device of MT-device type, which can be designed as shown in FIGS. 12–16, having transverse cavities, which are amongst other things intended for retaining guide pins by means of spring clips, one at each device.

U.S. Pat. No. 5,214,730 and the published European patent application EP-A1 0 530 744 describe modifications and improvements of optical contact devices of "MT" type having somewhat different designed spring clips for the retainment of two connection devices at each other. In FIGS. 9–11 in the patent U.S. Pat. No. 5,214,730 contact devices having a protruding portion next to fiber ends and guide pins are shown.

The published European patent applications EP-A1 0 484 180, EP-A2 0 635 741 and EP-A2 0 496 331 which corresponds to U.S. Pat. No. 5,337,094, and the published International patent application WO-A1 94/28448 disclose various types of semiconductor and optoelectronic devices and production methods thereof. In the published Swedish patent application SE-B 451623 corresponding to U.S. Pat. Nos. 4,507,345 and 4,520,061, a method and a mould are disclosed for manufacturing a block used for adaption of component specific connection openings to openings standardized as to their position.

SUMMARY

It is an object of the invention to provide methods and devices for manufacturing a plastics capsule containing optocomponents having an optical interface of MT-device type.

It is a further object of the invention to provide means for supporting adequately guide pins, in the production of an encapsulated optocomponent having alignment means comprising guide pins, so that the guide pins can be supported as close to a carrier of the component as possible. Hereby, the guide pins will not be deflected during injection of encapsulating material, what gives a high accuracy to the positioning of the carrier and guide grooves thereon in relation to the guide pins and the guide holes made by them.

It is a further object of the invention to provide an encapsulated optocomponent, which together with a specially designed spring clip allows a contact device or another similar capsule to be connected to the capsule so that the risk of losing the clip is reduced.

These and other advantageous objects are achieved by the invention and appear from description hereinafter, the scope of the invention being defined in and the characteristics thereof being set out in the appended claims.

When encapsulating an optocomponent an MT-device compatible interface is obtained in the capsule wall in the encapsulating operation. For the interface to operate in a satisfying manner, with regard to positioning, a simple after-treatment and a good transmission of signals, i.e. that attenuation and reflections have low levels, the optical interface of the plastics capsule is adapted to the shape of the MT-device so that:

I) in order to simplify the after-treatment, the optical interface of the plastic capsule is given a connection surface agreeing with the surface of the MT-device, II) alignment of the optocomponent carrier in the mould cavity is made by means of mould cavity guide or positioning pins, which in order to obtain a high accuracy are supported as close to the carrier as possible. Therefor, retainer means projecting from each mould cavity half are provided. This results in that cavities are formed straight through the capsule behind the carrier. The cavities have several functions:

a) they provide a possibility of emptying the guide pin holes and cleaning of material residues from the moulding and after a possible after-treatment of the guide bores.

b) the allow that spring clips can be attached by means of tongues inserted into the cavities. The tongues can be equipped with holes through which the guide pins can be pushed in order to secure the attachment of the clips even more.

When encapsulating an optocomponent with plastics, hence an MT-device compatible interface having holes for guide pins in the capsule wall and optical connection surfaces is provided. These holes are obtained from mould cavity guide pins, which are used for alignment of the optocomponent in a mould cavity during moulding of the encapsulating material over the component. In order to obtain a high accuracy in positioning the component during the moulding, the mould cavity guide pins are as short as possible and end just behind the component, where they are supported by projections extending from each mould cavity half. This results in that cavities are formed straight through the capsule behind the component. The cavities makes it possible to empty the guide pin holes and remove material residues from the moulding. Further, the cavities can be used for spring clips, which are used in order to keep the optocapsule to an optical connector device having a similar interface. The clips then have tongues, which are inserted in the cavities and which further can be equipped with holes, through which the guide pins can be pushed in order to ensure the clip can not be lost.

The following steps are generally carried out in manufacturing an encapsulated optocomponent, by moulding the optocomponent into an encapsulating material such as a plastics material. First the optocomponent is manufactured having guide grooves on a surface thereof, usually viewed as the top surface of the component. The positioning of the optocomponent in the mould cavity of a mould can be carried out in different sequential orders, so that in a first case, guide pins are placed in an opened mould cavity of the mould and that then the optocomponent is placed in the opened mould cavity, the component being guided in order that the guide pins will come in engagement with the guide grooves. In a second case, the optocomponent is placed in an opened mould cavity of the mould and then guide pins are placed in the mould cavity, the guide pins being guided to be in engagement with the guide grooves. Thereafter, the mould cavity of the mould can be closed, and in connection with this, the guide pins are supported on both sides of the optocomponent at a small distance therefrom, compared to the length of the guide grooves. Finally, the very encapsulation is carried out, by introducing the encapsulating material into the closed mould cavity and making it solidify, the mould cavity is opened and then the guide pins are extracted and the moulded body is finally removed from the mould cavity.

In order to achieve an optical interface directly on the capsule, the optocomponent is advantageously placed in the mould cavity against or at least close by or, preferably, at a side or a side surface of the mould cavity. Further, the guide pins should be placed in the mould cavity, so that they extend from one side or a side surface of the mould cavity and so that they are supported by support surfaces at this side of the mould cavity, the support surfaces for instance having the shape of groove shaped recesses, or support grooves on the separation surface, the inner surfaces, between two mould halves. Then the support grooves are located at such an inner surface, the separation surface, of a mould half and they extend from an outer side of the mould half to a cavity in the mould half, which forms a portion of the mould cavity. The guide pins can extend freely from said side through at least some distance into the mould cavity without touching walls or side surfaces therein, the distance being sufficient for the guide pins to enter the guide grooves of the component.

For additional support of the guide pins, they can be pressed against support surfaces on projections, which extend from a bottom surface of the mould cavity and in a direction essentially perpendicular to the longitudinal direction of the guide pins and also essentially perpendicularly to the inner surface of the mould half. These support surfaces on the projections can comprise different surfaces in groove shaped cavities or support grooves on the projections, which advantageously have rectangular cross sections. Further, the projections are advantageously provided in both mould halves, so that projections from each mould half are located opposite to each other. In this manner, through-passing channels can be formed in the moulding operation by the cavities, which remain after the projections. The projections can be freely located in the mould cavity, so that they do not connect to any side or side surface thereof.

Hereby, the encapsulated optocomponent will generally comprise an encapsulating material applied around an optocomponent. The optocomponent is located at a side surface of the encapsulating material and guide holes, obtained by the cavities, which remain after the guide pins, extend into the encapsulating material perpendicularly to this side surface. Further, there are through-channels or holes, which are formed by the support projections and thus pass entirely through the encapsulated optocomponent and are also positioned essentially perpendicularly to the guide holes and connect to them. The through-holes then get a rectangular cross section, if the support projections have rectangular cross sections, and then two side surfaces are advantageously located in the channels essentially perpendicularly to the guide holes and further one guide hole mouth ends entirely in such a side surface in a channel.

The through-holes are used for attaching a spring clip, which can generally be used for retaining optical units to each other. These units shall have connection surfaces intended to be placed at each other, which are designed having guide holes for guide pins and optical connection surfaces. In a known manner the clip comprises an essentially flat body and hook portions protruding therefrom essentially perpendicularly. It has holes formed in hook portions at an edge of its body and these holes are placed, so that when the hook portions are inserted into the through passing channels the holes are located opposite to the guide holes. Thereby, guide pins in the guide bores can come into engagement with the holes in the hook portions.

BRIEF DESCRIPTION OF THE DRAWINGS

The invention will now be described in more detail by way of non-limiting embodiments with reference to the accompanying drawings, in which.

DETAILED DESCRIPTION

Figure 1:
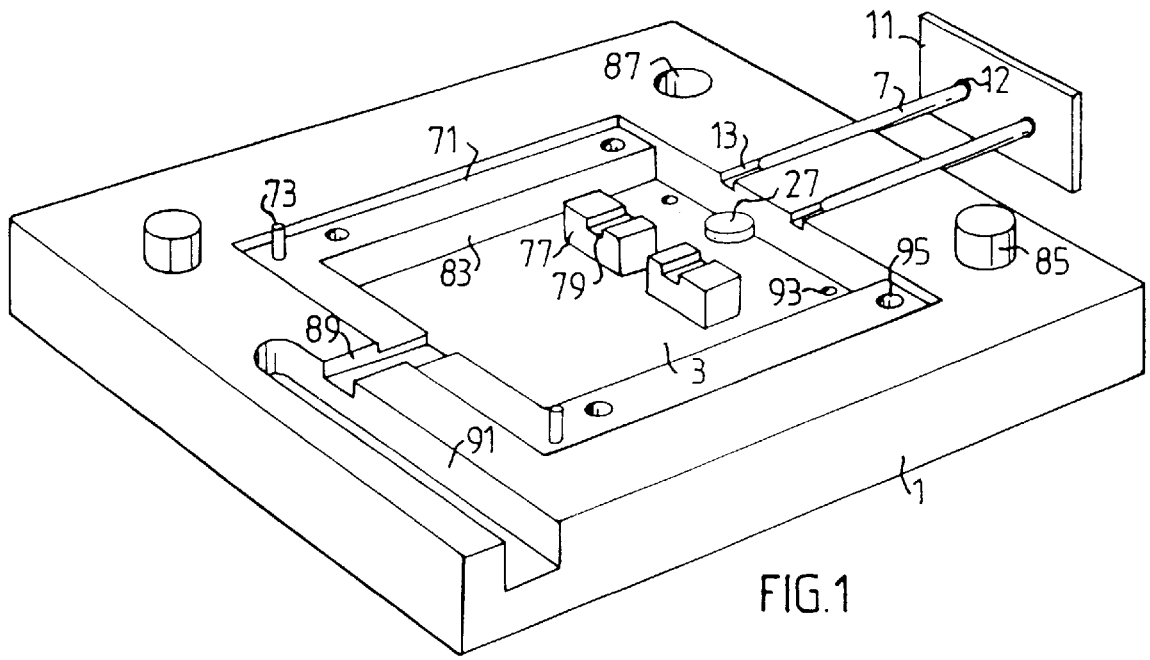
FIG. 1 is a detailed perspective view of a lower mould for manufacturing an encapsulated optocomponent.
Figure 3:
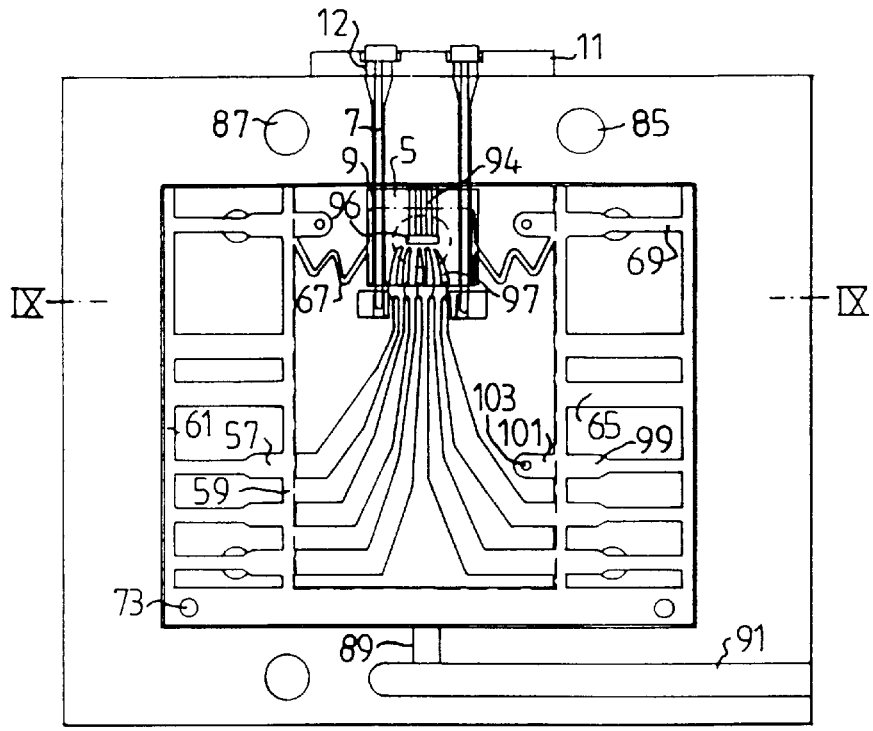
FIG. 3 is a view from above of the lower mould according to FIG. 1 having a leadframe and an optocomponent placed therein.
Figure 5:
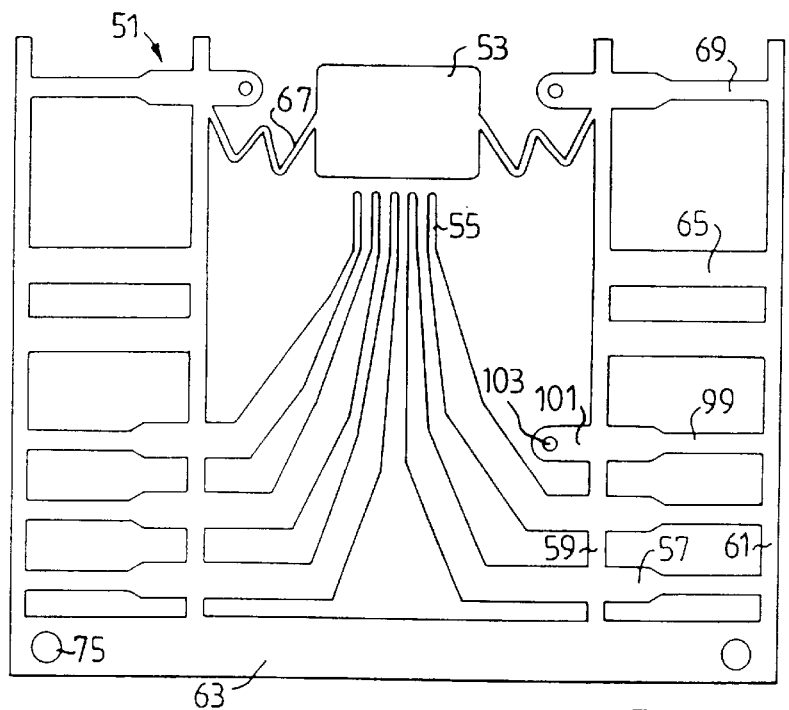
FIG. 5 is a view a leadframe for electric connection of an optocomponent.

In FIG. 1 a lower mould half 1 is shown having a mould cavity 3. The lower mould 1 has generally the shape of a rectangular block having side surfaces and a bottom surface, where the mould cavity 3 also has a rectangular shape and is formed in one of the large surfaces, the top surface of the lower mould 1, so that the edges and the surfaces of the mould 1 and the mould cavity 3 all are essentially parallel or perpendicular to each other. The mould cavity 3 has steps at three of its side surfaces in order to be able to receive a leadframe 51 of the type, which is shown in FIG. 5 and also in FIG. 3, where the lower mould half 1 is seen from above with a leadframe 51 and an optocomponent plate 5 placed therein.

The leadframe 51 has a generally flat shape and is manufactured of a thin electrically conducting plate such as copper plate or aluminium plate and can be cut out by punching or etching or similar methods. It comprises a flag 53 in the shape of a rectangular surface, which can be a whole surface or in certain cases, not shown, can be equipped with a centrally located hole. To the flag 53 the optocomponent plate 5 is applied, e.g. is cemented by means of a heat conducting adhesive. The leadframe 51 has a generally rectangular outer contour comprising outer edges, the flag being centrally located at one of the edges, here termed the front edge, so that an outer edge of the flag 53 forms a portion of this front outer edge. Connection fingers 55 extend from an area next to the edge of the flag 53, which is directed towards the centre of the leadframe and away from the mentioned front edge of the leadframe 51, and up to contact legs 57.

The contact legs 57 are in the embodiment shown placed perpendicularly to the two edges of the outer contour of the leadframe 51, which have the outer front edge located between them, where the flag 53 is placed. The legs 57 are mutually connected by inner bridges 59, which extend in parallel to and at a distance from the mentioned, opposite edges, and by outer bridges 61 extending along these edges. At the fourth, rear edge of the leadframe 51 there is a stronger or wider bridge part 63, from which the smaller inner and outer bridges 59 and 61 extend. In the areas where there are no contact legs 57, the pair of one inner and one outer bridge 59 and 61 at each edge is mutually connected by cross bridges 65 in order to keep these bridge parts attached to each other and for a simpler handling of the leadframe.

Hence, in the embodiment shown, the contact legs 57 are placed at the rear portion of the leadframe 51, which is located in the vicinity of the rear outer edge, which is opposite to the front edge, at which the flag 53 is arranged, i.e. they are located at a rather large distance from the flag. Further, the flag 53 is connected to the inner bridges 59 at this front edge, where there are no bridge parts, through thinner or slimmer zigzag shaped bridge parts 67, which extend from two opposite edges of the flag 53. These narrow, band shaped bridge parts 65 have, as has been mentioned, a zigzag design formed by portions located in one plane or generally an extension having curves or bends to alternatingly one and another direction. Further, they are attached close to an end portion of the inner bridge portions 59, where also a cross bar 69, which can have the same configuration as the outer portion of a contact leg 57, connects the inner and outer bridge portions 59, 61.

In the lower mould part 1, see FIG. 1, the leadframe rests on shoulders 71 at three of the side surfaces of the mould cavity 3. The width of these shoulders 71 is adjusted, so that the shoulder ends next to the inner edge of the inner bridges 59 of the leadframe 51 and the inner edge of the stronger rear bridge portion 63 of the leadframe, in the respective cases. The height of the shoulders 71 is adjusted, so that the distance between the top surfaces of the shoulders and the lower mould half 1 is approximately equal to the thickness of the electrically conducting leadframe 51. Fixed guide pins 73 protrude from the shoulder 71 upwards to be placed in holes 75 in the wider rear bridge portion of the leadframe 51, see FIG. 12, in order to keep the leadframe in its correct position in the mould cavity 3.

For the positioning of a component carrier there are guide pins 7 having essentially the shape of straight circular cylinders having rounded off tips at their one end. At their other end, they are retained at a plate 11, which, in a moulding operation is pressed against a side surface of the whole compressed mould. The guide pins 7 can at their end at the plate 11 be equipped with heads, not shown, in the same manner as conventional bolts or nails, and with their cylindrical portion pass through bores 12 in the plate 11, which have a section, that is a little wider than the diameter of that portion of the guide pins 7 which has a uniform thickness, in order to allow some possibility of displacement of the guide pins.

For the guide pins 7 there are grooves 13 on the marginal surface of the top surface of the lower mould half 1, these grooves extending from the outer side surface of this mould half and passing in to the mould cavity 3. On the bottom of the mould cavity 3 in the lower mould half 3 supports 77 are provided, which protrude upwards and have guide grooves 79 on their end surfaces, these guide grooves 79 being located in the extension of the grooves 13 on the edge of the mould half and forming inner supports for the guide pins 7, when they are inserted in the mould. The supports 77 are arranged adjacent to the inner edge of an optical component plate 5, compare FIG. 3, when this is placed inside the mould cavity 3 next to one of its side surfaces, so that the guide pins 7 extend freely over the whole component plate 5 between the supports in the grooves 13 of the lower mould part 1 and the guide grooves 79 on the supports 77 and only over short distances in addition thereto and between the component plate 5 and the support grooves.

Figure 2:
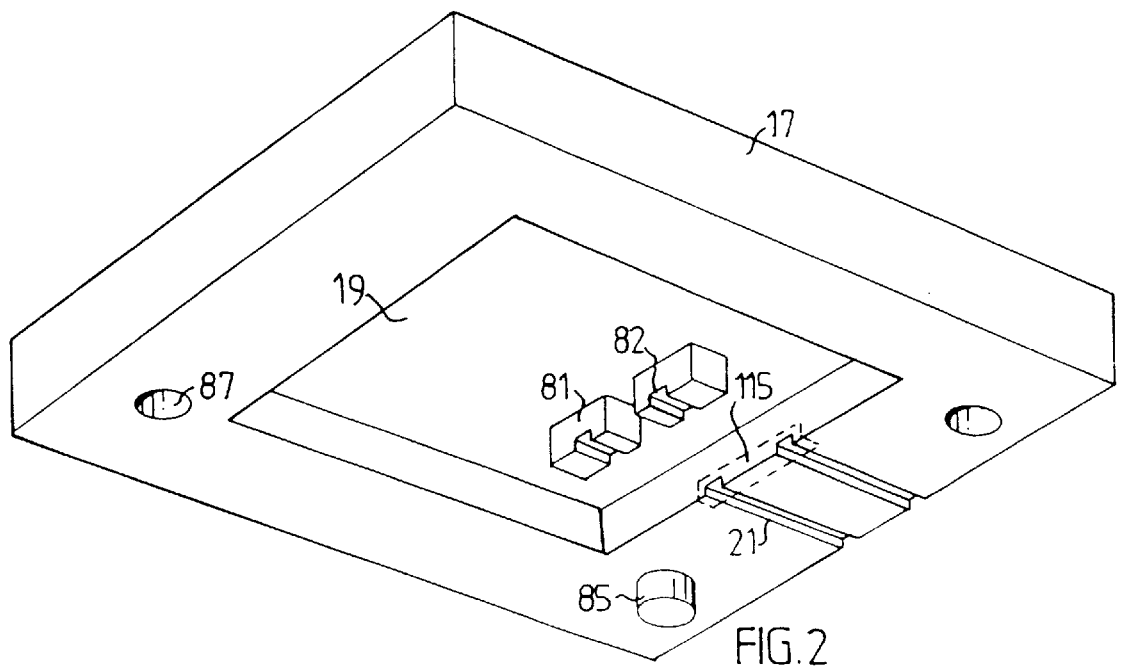
FIG. 2 is a perspective view of an upper mould intended to be used together with the mould of FIG. 1.

The upper mould half 17, see the perspective view of FIG. 2, is also configured as a rectangular block having side surfaces, a top surface and a rectangular mould cavity 19 formed in a bottom surface and having surfaces parallel and perpendicular to surfaces and edges of the upper mould half 17. Grooves 21 for the guide pins 7 are provided on the marginal area of the lower surface, which surrounds the mould cavity 19, and extends from an exterior side of the upper mould half 17 in to the mould cavity 19. In this upper mould cavity there are also protruding supports 81 having support grooves 82 on their lower, end surfaces, these support grooves 82 constituting, in the same manner as in the lower mould half, an extension of the guide grooves 21 in the very mould half. The upper protruding supports 81 are arranged, so that they are located freely without connection to any side surface of in the mould cavity 19 and so that they, when the two mould halves 1 and 17 are placed on top of each other, are placed exactly above the supports 77 of the lower mould half 1. The two support parts 77 and 81 further suitably have a similar and rectangular cross section, as seen perpendicularly to the large surfaces of the mould halves.

Figure 10A:
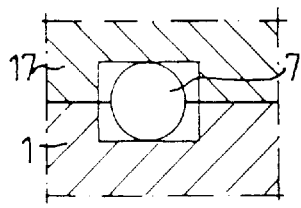
FIGS. 10a–10c are partial sectional views of the profile of support grooves for support pins.
Figure 10B:
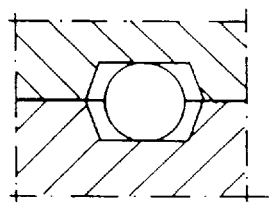
Figure 10C:
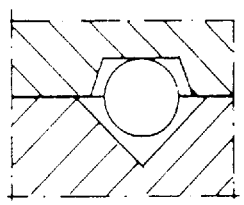

Different shapes of the support grooves 13, 17 and 21, 82 respectively of the lower and upper mould half 1 and 17 appear from the cross sectional views of FIGS. 10a–10c, which show partial sections perpendicular to the longitudinal direction of the grooves, when the mould halves have been applied to each other for moulding the encapsulating material. The grooves can have a rectangular cross section as shown in FIG. 10a. Alternatively, the cross section can be a symmetric trapezius having sides which as to their positions diverge a little from a perpendicular position according to FIG. 10b. It can be advantageous to always have the grooves of the upper mould 17 shaped with a flat bottom portion as in FIGS. 10a and 10b, so that the guide pins 7 can move a little laterally in order to allow an accurate positioning in relation to a component plate having V-grooves placed in the mould cavity, since the guide pins 7 for moulding are pressed in a direction towards the upper mould half. The flat bottom portions should then be placed approximately perpendicularly to this pressing direction.

For the grooves of the lower mould half, it can, however, be sufficient to design the grooves to have a V-shaped cross section, see FIG. 10c. Such V-grooves can have fairly flat positioned side surfaces, so that the centre angle of the cross section of the grooves considerably exceeds 50–60°, which is the normal value for other V-grooves, which are used for the accurate positioning of cylindric bodies, e.g. positioning grooves for a component plate or carrier, see below. The centre angles can for instance be in the range of 90–120°. The grooves can not in any case be so large, that encapsulating material will be able to penetrate through the narrow slits next to the guide pins during the moulding operation. These slits can for instance be allowed to have a largest width of about 20 $\mu$m for commonly used encapsulating materials. The total depth of the grooves of the lower mould half can somewhat exceed the radius of the cylindrical part of the guide pins 7 and the grooves of the upper mould half can have a depth essentially corresponding to this radius. In any case the total depth shall, when the grooves of the top and bottom half are placed above and close to each other, somewhat exceed the diameter of the cylindrical part of the guide pins 7.

Through the configuration and the positioning of the supports 77 and 81 for the guide pins 7, through-holes 110 will be formed during the embedment of the component plate 5, which pass from one side of the encapsulated component to the other one. These through-holes 110 then also have a rectangular cross section, see the schematic perspective view of an encapsulated optocomponent of FIG. 6. The mould cavity 19 of the upper mould half 17 has a contour, which essentially follows the contours of the side surfaces of the shoulders 71 extending perpendicularly from the bottom surface of lower mould cavity 31, see FIG. 1, and the side surface of the lower mould cavity 3, next to which the optical component plate 5 is placed during the moulding operation and where also the flag 53 of the leadframe 51 is placed, when this is correctly placed in the mould.

Positioning pins 85 and corresponding holes 87 are arranged on the top surface of the lower mould half 1 and on the bottom surface of the upper mould half 17. These positioning pins place the two mould halves 1, 17 in mutually correct positions during the moulding process.

An inlet or sprue channel 89 for receiving the material to be injected is arranged as a groove on the lower mould half 1 and extends from the side surface of the mould cavity 3 of this mould half, which is opposite to the side surface, where the guide pins 7 enter. The channel 89 connects to a channel 91 having somewhat larger cross section dimensions, which extends in parallel to the mentioned side surface of the mould cavity 3 up to an outer side surface of the lower mould half 1.

Ejector pins, not shown, can enter through holes shown at 93 through the lower mould half 1 up to the bottom therein in order to release, after a completed encapsulating moulding operation, the whole capsule from the lower mould half 1. Also holes 95 through the lower mould half, which end on the shoulders 71, where the outer contact legs of the leadframe rest in the mould cavity 1, are intended for ejectors, not shown.

In manufacturing an encapsulated optocomponent by means of the moulding tools showed in FIGS. 1–4, the optocomponent plate is hence first placed on or attached to the flag 53 of the leadframe 51 by means of a suitable heat conducting adhesive, e.g. some epoxy resin containing a metal filler such as silver balls or the like. On the optocomponent plate 5, waveguide elements 94, see FIG. 3, can extend from one edge of the plate, in the preferred case from the edge, which when the optoplate 5 is correctly placed in the lower mould cavity 3, is placed quite next to the side surface of this mould cavity 3, where the grooves 13 for the guide pins 7 end. The waveguides 94 connect to the very optocomponent, showed at 96, which can be an active optical component in the form of a monolithic unit. The active component unit 96 is by means of connecting wires, not shown, connected to electrical conductive paths 97 on the component plate 5. These conductive paths 97 are then connected at their other end to the ends of the contact fingers 55 of the leadframe 51 by means of some suitable method, e.g. by soldered or better by friction welding bonded connection wires, not shown.

The leadframe 51 having a component plate 5 attached thereto, which is also electrically connected thereto, is then placed in the lower mould half 1, so that the component plate 5 is placed at that side surface in the mould cavity 3, where the grooves 13 of the edge of the mould half for the guide pins 7 enter, and so that the guide grooves 9 of the optocomponent plate are aligned with these grooves and also with the support grooves 79 on the upstanding supports 77. Further, the inner bridge parts 59, the outer bridge parts 61 and the contact legs 57 extending therebetween, the cross bars 65 and 69, and finally also the wider bridge part 63 rest on the shoulder 71 of the lower mould part 1. Then, the positioning pins 73 are inserted in the corresponding holes 75 of the leadframe in order to keep it in a correct position. The leadframe 51 in the shape of a thin metal foil is then placed having its top surface located essentially in the same plane as the top surface of the lower mould half 1.

Figure 4:
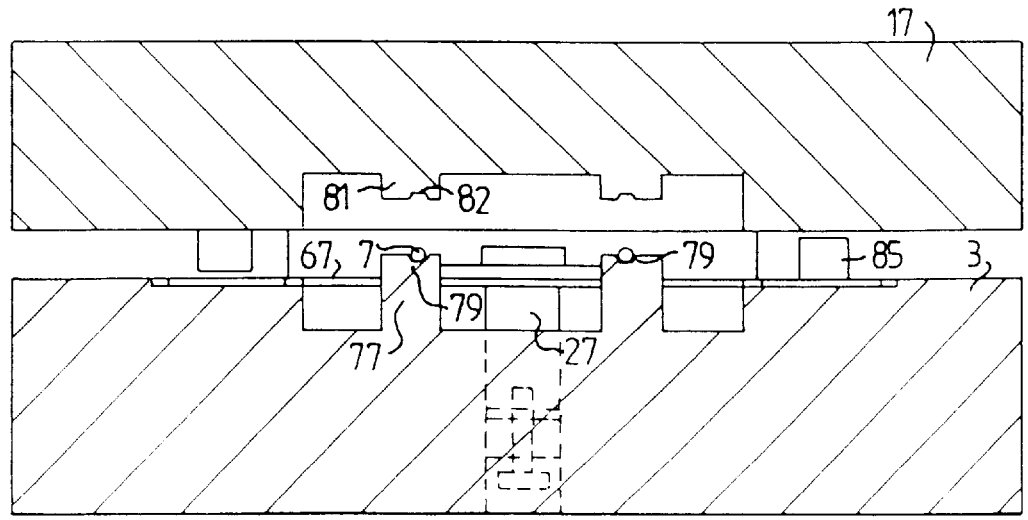
FIG. 4 is a sectional view of the lower and the upper moulds of FIGS. 1 and 2, placed above each other.

A plunger 27, see in particular FIG. 4, is initially set with its free upper surface at an adjusted level and comes in contact with the bottom side of the flag 53, so that the bottom side of the flag 53 is located essentially in the same plane as the bottom side of the other parts of the leadframe 51 or so that the flag together with the optical component plate 5 is pressed a small distance upwards from this position. Thereafter, the guide pins 7 are inserted into the corresponding guide grooves 9 of the component plate 5, by a suitable movement of its support plate 11 to contact the outer side of the lower mould half 1. When the support plate 11 has been advanced, the guide pins 7 will then rest in the guide grooves 9 of the component plate 5 and will also be located in the support grooves 79 of the lower upstanding supports 77. After this, the upper mould half 17 is applied, so that the guide pins 85 pass into the corresponding guide holes 87 in the other mould half 17. The guide pins 7 are then still positioned in the guide grooves 9 of the plate 5 and they are definitively positioned and even better retained therein, by releasing the plunger 27, so that it can act elastically upwards against the flag 53 and press it along with the component plate 5 upwards hard against the guide pins.

Hence, the component plate 5 together with the leadframe is now completely enclosed in a mould cavity formed by the two mould cavities 3 and 19. The plunger 27 presses the flag 53 of the leadframe 51 upwards and thereby also the component plate 5, so that the guide pins 7 are inserted and very accurately positioned in the guide grooves 9. The guide pins 7 will then, with portions close to the guide grooves 9 of the component plate 5, be in engagement with the bottom surface of the upper support grooves 21 and 82. The necessary lateral and elevational movement of the optocomponent plate 5 for positioning its guide grooves 9 against the guide pins 7 is made possible by the zigzag shaped narrow bridge parts 67, by means of which the flag 53 is connected to the other parts of the leadframe 51. Connecting wires between the optocomponent plate 5 and the contact fingers 55 of the leadframe 55 could then be obstructive, but these connection wires must be thin and flexible enough to make the exact positioning of the component plate 5 with its guide grooves 9 well receiving the guide pins 7 possible. The guide pins 7 can also require a certain movement, both lateral and upwards, which is made possible by the above mentioned, somewhat loose suspension thereof in their support plate 11.

The two mould halves 1 and 17 are clamped to each other with a required compression force in order not to be separated during the following injection of a plastics material. Further, the support plate 11 for the guide pins 7 is clamped hard to the side surfaces of the mould halves. Thereafter, a suitable plastics material is injected through the inlet channel formed by the grooves 91, 89 together with the bottom surface of the upper mould half 17. The injected plastics material is made to solidify, e.g. is allowed to harden a suitable time, in the case where the injected plastics material is of thermosetting type.

After this, the mould halves 1 and 17 are separated, suitable ejectors are introduced through the holes 93, 95 and the encapsulated component is hereby released from the mould halves and in particular from the lower mould half 1. Before this, the guide pins have been extracted from the mould cavity by removal of its support plate 11 from the mould halves 1 and 17.

Thereafter, the encapsulated component can be rid of non-desired parts of the leadframe 51. This is performed by cutting off the inner and outer bridge parts 59 and 61 respectively on both sides of the contact legs 57 and also on both sides of the special cross bars 69 at the front edge of the optocomponent. When these parts of the inner and outer bridges 59 and 61 have been removed, only the connection legs 57 hence protrude from the sides of the capsule, of which only one, such as the one shown at 99, can have a supporting function. Also the front support legs 69 project from the capsule. These supporting legs 99 and 69 respectively remain secured to the capsule, by the fact that they have portions 101, see FIGS. 3 and 5, which extend inside the inner bridge part 59, and by the fact that these portions are equipped with anchoring holes 103, in which plastics material can be applied during the encapsulation.

Figure 6:
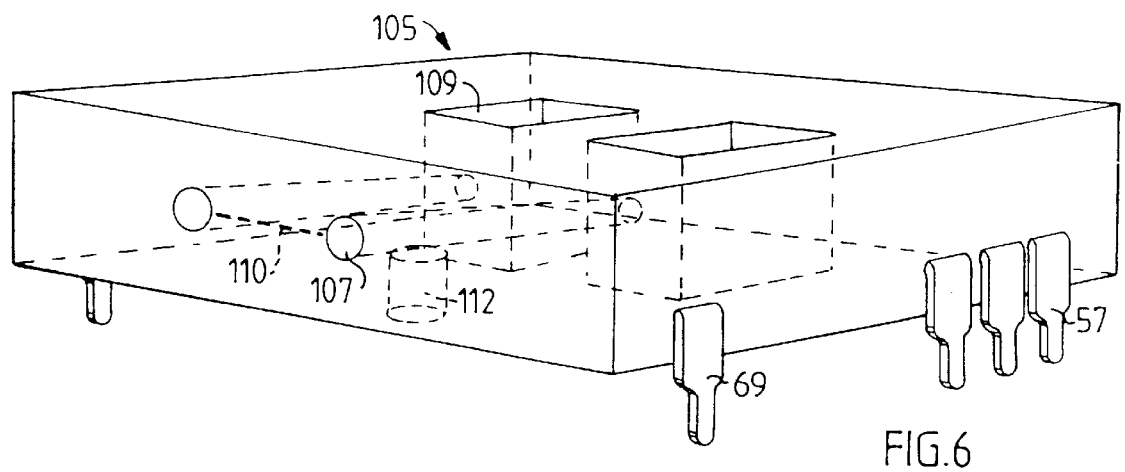
FIG. 6 is a perspective view of an optocapsule manufactured by means of the moulds of FIGS. 1 and 2.

Moulding residues can be left in the holes 109, see FIG. 6, from the supports 77 and 81 for the guide pins 7 and these residues are removed in a suitable manner. Moulding residues in the holes 107 from the guide pins 7 can then easily be pressed out through the first mentioned holes 109. The front edge of the optocapsule, where the holes 107 corresponding to the guide pins 7 end and also where the ends of the waveguides 93 are placed, are then polished, so that these ends of the waveguides are exposed in order to be capable of connection with a correspondingly designed optical component unit or an optical connector device having holes for guide pins and outer optical connector surfaces placed between the mouths of the holes. Further, the plunger 27 leaves a cylindrical hole 112 in the under side of the encapsulated component, which hole extends up to the bottom side of the flag 53 of the leadframe 51 or in the case the flag itself has a hole, up to the bottom side of the embedded component plate 5 itself. This hole 112 can be used for for instance thermal dissipation from the component plate.

The encapsulated optocomponent 105 then has the general shape shown in a perspective view in FIG. 6, the capsule 105 having the shape of a rectangular block or a rectangular plate having large top and bottom surfaces. Holes 107 for the guide pins extend from a front side of the capsule 105 up to rectangular through-holes 109. These holes extend from one of the large surfaces of the capsule 105 to its other large surface, perpendicularly to them. Between the mouths of the holes 107 in the front side surface of the capsule 105, end surfaces 110 of the waveguides 93 are located, which are accessible from the outside, for coupling of optical signals to another encapsulated component or another optical connector device having connections of the same shape.

Figure 7:
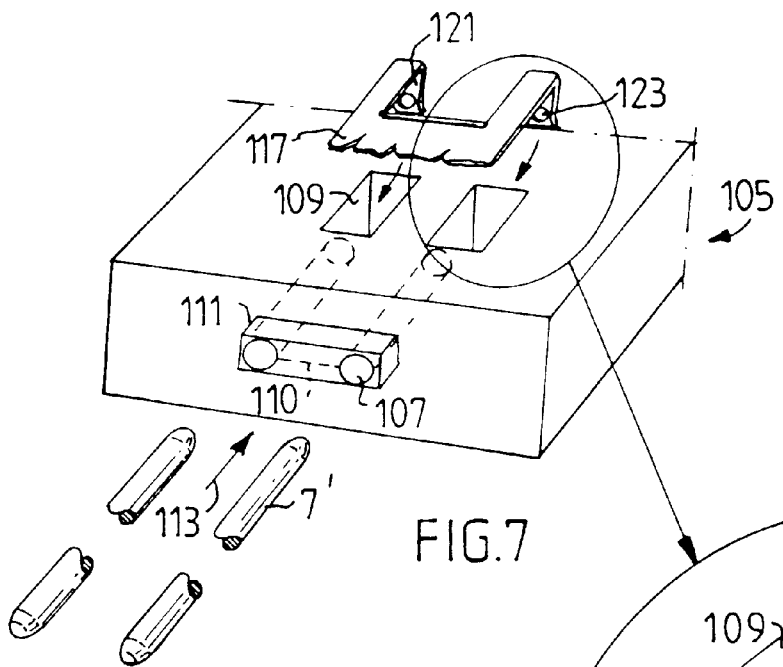
FIG. 7 is a perspective view of the front part of an alternative embodiment of the encapsulated optocomponent together with a section of a spring clip.
Figure 8:
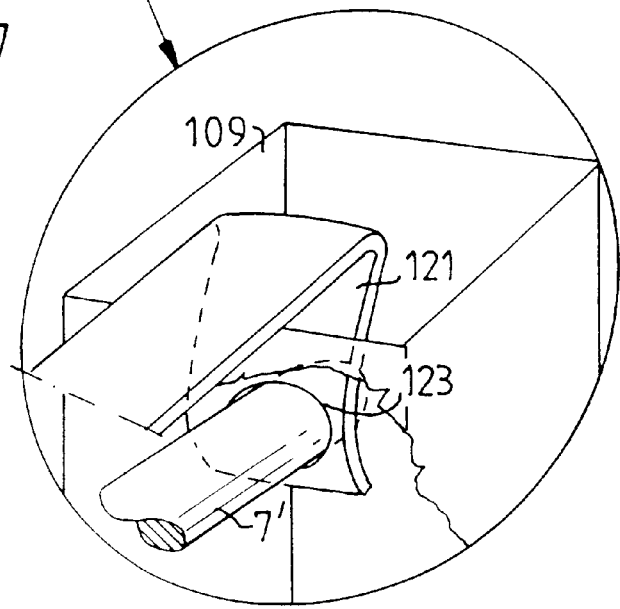
FIG. 8 is a part of the perspective view of FIG. 7 as seen in a larger scale.

A suitable shape of the front side of the optical capsule 105 is schematically shown by a partial perspective view of the front portion of the capsule in FIG. 7. Here, the front surface of the capsule 107 has a projecting portion 111, which in the embodiment shown has a generally rectangular block shape having edges and surfaces parallel to edges and surfaces of the capsule 105. The projecting portion 111 is given such a size, that the front end of the component plate 5 is entirely placed within this portion. This means, that also the mouths of the holes 107 from the guide pins 7 are entirely within this projecting portion, on its front surface, and that also the end surfaces 110 of the waveguides 93 placed between these holes 107 are located there. Such an embodiment of the front side of the capsule 105 makes possible a simple polishing of the front surface of the projection 111 intended to be coupled to a similar optical component, not shown.

The projecting portion 111 can be obtained by suitable rectangular recesses in the lower and upper mould halves 1 and 17 respectively, compare FIGS. 1–4. Such a cavity is shown with dashed lines in FIG. 2 for the upper mould half 17.

Figure 9:
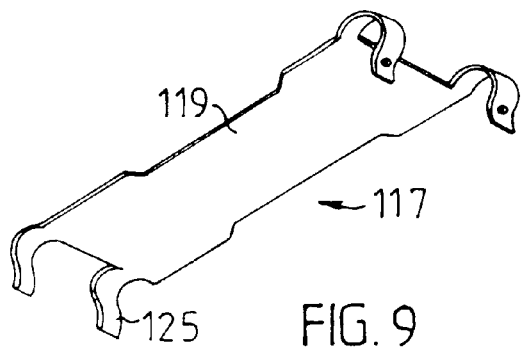
FIG. 9 is a perspective view of a spring clip for retaining a connector device.

The holes 109, which are left from the support parts 77 and 81 respectively in the capsule 105, can be used to efficiently retain the capsule at another similar capsule. A suitably shaped spring clip 117, see FIG. 9, can then be used. The spring clip 117 has a body in the shape of a plate part 119 having hook portions or claws 121, 125 formed at its opposite ends, which extend in an essentially right angle in relation to the body 119. In the claws at one end there are holes 123, which cooperate with loose guide pins 7', when these are inserted in the holes 107 intended therefor, whereas any such holes are not provided in the claws 125 at the other end of the clip 117.

At connection of a capsule 105, having or having not a projecting portion 111, to another capsule or a correspondingly designed connector device, first loose guide pins 7' are placed in the holes 107 of the capsule, however without being inserted so far that they enter the transverse channels 109. Then, the clip 117 is applied having its claws 121, which are equipped with the holes 123, in the transverse holes 109 of the capsule. Thereupon the second capsule or device is pushed with its corresponding guide holes onto the ends of the guide pins 7', which then are protruding, until a contact is obtained between the polished areas at the end surfaces 110 of the waveguides. The guide pins 7' are then also pushed, if they have a suitably adjusted length, further into their guide holes in the first capsule and engage in the holes 123 in the claws 121 of the clip 117. When the end surfaces 110 of the waveguides are in contact with each other, the claws 125 having no holes at the other end of the clip are lowered into the holes 109 of the second capsule or for instance behind a rear side of a connection device, e. g. an MT-device. Hereby, the clip becomes well anchored, by the fact that the guide pins and the first mentioned capsule intrudes through holes 123 in the clip, and the clip then can not be loosed or be lost.

We claim:

1. A method of manufacturing an encapsulated optocomponent by embedding the optocomponent in an encapsulating material, comprising the steps of:

first manufacturing the optocomponent comprising a surface having guide grooves thereon, in a first case:

placing guide pins in an opened mold cavity of a mold, supporting each guide pin at two distinct places wherein the two distinct places define a location therebetween where the optocomponent is to be placed, placing the optocomponent on the location in the open mold cavity of the mold, so that each guide pin engages one of the guide grooves, in a second case:

placing the optocomponent in an opened mold cavity of a mold, placing guide pins in the opened mold cavity so that each guide groove engages one of the guide pins whereby each guide pin is supported at two distinct places, the optocomponent being located between the two distinct places, closing the mold cavity of the mold, introducing the encapsulating material into the closed mold cavity and allowing the material to solidify, opening the mold cavity, pulling the guide pins out and removing the molded body from the mold cavity.

2. The method according to claim 1, wherein the optocomponent is placed in the opened mold cavity at a first side or a first side surface of the mold cavity.

3. The method according to claim 1, wherein the guide pins are placed in the mold cavity, so that they extend from a first side of the mold cavity.

4. The method according to claim 3, wherein the guide pins are supported by support surfaces at the first side of the mold cavity.

5. The method according to claim 3, wherein the guide pins extend freely at least some distance into the mold cavity from the first side, without touching walls therein.

6. The method according to claim 3, wherein the optocomponent is placed in the opened mould cavity at a side or a side surface of the mould cavity.

7. The method according to claim 1, wherein in supporting each guide pin at two distinct places, one of the two distinct places is at a support surface on a projection, which extends from a bottom surface in the mold cavity.

8. A mold for encapsulation of an optocomponent by embedding in a molding operation the optocomponent in an encapsulating material, the optocomponent comprising a first surface, a second surface opposite the first surface and guide grooves on the first surface, the mold comprising:

two mold halves having inner surfaces, which inner surfaces are intended to be pressed against each other in the molding operation, a mold cavity being formed by the mold halves in pressing the molding halves against each other; and support means for supporting at least two guide pins, intended to engage in the guide grooves of an optocomponent placed in the mold cavity in the molding operation, the support means for each guide pin comprising a first support and a second support, the second support being distinct from the first support, the optocomponent being in the molding operation located between the first and second supports of the support means for each guide pin.

9. A mold for encapsulation of an optocomponent by embedding in a molding operation the optocomponent in an encapsulating material, the optocomponent comprising a first surface, a second surface opposite the first surface and guide grooves on the first surface, the mold comprising:

two mold halves having inner surfaces, which surfaces are intended to be pressed against each other in the molding operation, a mold cavity being formed by the mold halves in pressing the molding halves against each other; and support means for supporting at least two guide pins, intended to engage in the guide grooves of an optocomponent placed in the mold cavity in the molding operation, the support means for each guide pin comprising a projection, which has a support surface for the guide pin and which extends from a bottom of a cavity in one of the mold halves, which cavity forms a part of the mold cavity formed in pressing the mold halves against each other, the projection extending substantially perpendicularly to the inner surface of said one of the mold halves and/or to a longitudinal direction of the guide pin.

10. The mold according to claim 9, wherein the support surface on each of the projections comprises surfaces in a support groove on the projections.

11. The mould according to claim 9, wherein the projections have a rectangular cross section.

12. The mold according to claim 9, wherein the projections extend from bottom surfaces of the two mold halves, so that projections from each mold half are located opposite to each other in the mold cavity formed in pressing the mold halves against each other and then connect to or are in contact with each other, whereby channels passing through the encapsulated component are formed by the projections in the molding operation.

13. The method of claim 1, wherein, in supporting of each guide pin at two distinct places, the two distinct places are supported at distances from the optocomponent which distances are small compared to the lengths of the guide grooves.

14. The mold of claim 8, wherein the first and second supports of the support means for each guide pin support the guide pin at places having distances from the optocomponent which distances are small compared to lengths of the guide grooves.

15. The mold of claim 8, wherein the first support of the support means for each guide pin comprises grooves on an inner surface of one of the mold halves, which grooves extend from an outer side of said one of the mold halves to a cavity of said one of the mold halves, which cavity forms a part of the mold cavity formed in pressing the mold halves against each other.

16. The mold of claim 8, wherein the second support of the support means for each guide pin comprises a projection, which has a support surface for the guide pin and which extends from a bottom of a cavity in one of the mold halves, which cavity forms a part of the mold cavity formed in pressing the mold halves against each other, the projection extending substantially perpendicularly to the inner surface of said one of the mold halves and/or to a longitudinal direction of the guide pin.

17. The mold of claim 16, wherein the support surface on each of the projections comprises surfaces in a support groove on the projection.

18. The mold of claim 16, wherein the projections have a rectangular cross section.

19. The mold of claim 16, wherein the projections extend from bottom surfaces of the two mold halves, the projections having such positions that projections from each mold half are located opposite to each other in the mold cavity formed in pressing the mold halves against each other and then connect to or are in contact with each other, whereby in the molding operation channels passing through the encapsulated optocomponent are formed by the projections.

20. An encapsulated optocomponent, comprising:

an optocomponent, an encapsulated material applied around the optocomponent, the optocomponent being located at a first side surface of the encapsulating material;

guide holes extending into the encapsulating material perpendicularly to the first surface, the guide holes being intended to receive guide pins for aligning the encapsulated component with another component; and through-holes passing through the encapsulated optocomponent and connecting substantially perpendicularly to the guide holes.

21. The encapsulated optocomponent of claim 20, wherein the through-holes have a rectangular cross section, each through-hole having two opposite walls which are located substantially perpendicularly to the guide holes, the through-holes and guide holes being so located that each portion of the guide holes completely ends in an individual one of the side walls.

22. The encapsulated optocomponent of claim 20, wherein the optocomponent substantially has the shape of a plate, a plane through the plate being located perpendicularly to the first side surface.

\* \* \* \* \*